United States Patent [19]

Feldstein

[11] 4,261,747

[45] Apr. 14, 1981

[54] DISPERSIONS FOR ACTIVATING NON-CONDUCTORS FOR ELECTROLESS PLATING

[76] Inventor: Nathan Feldstein, 63 Hemlock Cir., Princeton, N.J. 08540

[21] Appl. No.: 967,066

[22] Filed: Dec. 6, 1978

Related U.S. Application Data

[60] Division of Ser. No. 854,909, Nov. 25, 1977, Pat. No. 4,132,832, and a continuation-in-part of Ser. No. 731,212, Oct. 12, 1976, Pat. No. 4,136,216, which is a division of Ser. No. 607,506, Oct. 4, 1974, Pat. No. 3,993,799, and a continuation-in-part of Ser. No. 512,224, Oct. 4, 1974, abandoned.

[51] Int. Cl.$^3$ ................................................ C23C 3/02
[52] U.S. Cl. ............................... 106/1.11; 252/313 R; 427/98; 427/304; 427/305; 427/306
[58] Field of Search ............................. 106/1.05, 1.11; 427/304, 305, 306; 252/313 R

[56] References Cited

U.S. PATENT DOCUMENTS

| | | | |
|---|---|---|---|
| 2,438,230 | 6/1948 | Ryznar | 252/313 R |
| 3,082,103 | 3/1963 | Wainer | 106/57 |
| 3,635,668 | 1/1972 | Barker | 424/140 |
| 3,657,003 | 4/1972 | Kenney | 106/1.11 |
| 3,958,048 | 5/1976 | Donovan et al. | 106/1.11 |
| 3,993,491 | 11/1976 | Feldstein | 106/1.11 |
| 3,993,799 | 11/1976 | Feldstein | 106/1.11 |
| 3,993,801 | 11/1976 | Feldstein | 106/1.11 |
| 4,048,354 | 9/1977 | Feldstein | 106/287.32 |

*Primary Examiner*—Lorenzo B. Hayes

[57] ABSTRACT

Metallic surfaces are imparted to non-conductive or dielectric substrates by an electroless (chemical) coating process comprised of coating the surface of the substrate with colloids of catalytic non-precious metals wherein the metals are either part of an alloy or in the elemental state or a compound and wherein the colloidal compositions are prepared by a special method which renders the colloids a greater catalytic activity when used in the plating process.

8 Claims, No Drawings

4,261,747

DISPERSIONS FOR ACTIVATING NON-CONDUCTORS FOR ELECTROLESS PLATING

REFERENCE TO PRIOR APPLICATION

This is a division of application Ser. No. 854,909 filed Nov. 25, 1977, now U.S. Pat. No. 4,132,832 which in turn is a continuation-in-part of U.S. application Ser. No. 731,212, filed Oct. 12, 1976, now U.S. Pat. No. 4,136,216, which is a divisional application of U.S. application Ser. No. 607,506, now U.S. Pat. No. 3,993,799 which is a continuation-in-part of U.S. application Ser. No. 512,224 filed Oct. 4, 1974, now abandoned.

BACKGROUND OF THE INVENTION

Electroless or autocatalytic coating of dielectric surfaces is a well known process finding wide-spread utility in the preparation of such diverse articles as printed circuits, automotive trim, mirrors, etc.

Normal commercial electroless coating processes generally involve an initial cleaning and etching of the dielectric substrate by physical or chemical means to improve adherence of the metallic coating. The etched surface is then catalyzed by suitable catalytic compositions and processes to provide a surface capable of electroless plating initiation. In the prior art, the catalytic treatment generally encompassed the use of precious metals. More recently, compositions and processes utilizing non-precious metals have been disclosed suitable for electroless plating of dielectrics. U.S. Pat. Nos. 3,993,491, 3,993,801, 3,993,799, 3,958,048, 4,048,354, and Ser. No. 645,198 now U.S. Pat. No. 4,087,586 and Ser. No. 720,588 now U.S. Pat. No. 4,082,899 which are included herein by reference disclose the prior art as well as the recent advancements in which non-precious metals have been reported.

In reviewing the teachings disclosed in U.S. Pat. Nos. 3,993,799 and 3,958,048 it is evident that colloids or either hydrous oxides, metals (elemental state) and alloys (phosphides, borides, nitrides, etc.) are useful in the catalytic treatment either as a two step or a single step activation treatment. Generally speaking, preferred metals in the above colloids are cobalt, copper, iron and nickel, although as suggested in U.S. Pat. No. 3,993,799 other non-precious metals may be used. It is recognized that it is generally desireable to have suspensions (dispersions) of very fine particulate matter for both stability (i.e., against precipitation), reactivity, and adhesion to the substrate. Accordingly, it is highly desirable to prepare such suspensions under conditions which would yield finely divided and highly stable colloids.

It is also well recognized in the art of electroless plating that for effective electroless plating onto catalytically treated non-conductors at least one of the following requirements must be met:

Case I: The catalytic surface may react chemically with the reducing agents present within the electroless plating bath. More than one chemical reaction may take place.

Case II. The catalytic surface may react chemically with the metallic ions present within the electroless plating bath in a galvanic type replacement reaction.

In Case I, the chemical reactions may range from chemical reduction of the catalytic components present on the dielectric, and/or decomposition of the reducing agent at the interfere ultimately yielding hydrogen gas via an active reducing agent intermediate. In Case II, to permit a galvanic replacement reaction, it is recognized that some of the metal ions present in solution must be more noble with respect to the metal and metal ions present on the treated non-conductor surface. Such relationship is well recognized from the EMF series. Thus, while metals like copper, cobalt, nickel and iron may be preferred as recognized in U.S. Pat. No. 3,993,799, yet other non-precious metals may also be of potential use (e.g., zinc, manganese, etc.). It is further recognized that it is highly desireable to have catalysts which when contacted with the chemical (electroless) plating bath will yield short induction times. Generally speaking it is recognized that whenever the induction time is short, the probability for complete metallic coverage is excellent and thus eliminates the problem of skip plating.

SUMMARY OF THE INVENTION

It is the principle object of the present invention to provide an effective and economical process and compositions for preparing dielectric substrates for electroless coating or plating of a metallic surface thereon, and to provide an electroless coating process including such preparation.

It is a particular object of the present invention to provide improved compositions through which the catalytic activity would be increased. Other objectives of the present invention, if not specifically set forth herein, will be apparent to the skilled artisan upon the reading of the detailed description of the invention which follows.

Suprisingly, it has been discovered that the aforesaid objectives may be achieved by a process and composition which render the colloidal composition a greater reactivity and hence provide a greater catalytic activity for the colloid when adsorbed onto the non-conductors. The improved compositions incorporate the addition of metallic ions (e.g., nickel) subsequent to the nucleation of the colloidal dispersion comprising copper.

DETAILED DESCRIPTION OF THE INVENTION

The process of the present invention is applicable to metallic plating of a wide variety of dielectric (non-conductor) substrates. Dielectric substrates described in the prior art, including thermoplastic and thermosetting resins and glass, may also be suitably plated in accordance with the present invention. Normally, these substrates will be cleaned and surface treated prior to plating in order to improve adherence of the metallic coating. The present invention is an improvement to the processes and compositions disclosed in the above cited references.

The colloids of the present invention are generally prepared by adding the selected compound of a catalytic metal or a salt thereof, e.g., the sulfate, nitrate, chloride, bromide or acetate salts, to an aqueous medium to produce an aqueous solution and reacting the above solution with a chemical agent which will yield by precipation (nucleation) either a reduced metal, compound or an alloy of same metal. The precipitation reaction is generally carried forth in the presence of at least one colloid stabilizer thereby stabilizing the resulting colloid formed and insuring good dispersion for the medium.

Although there are various methods for the production of colloids, e.g., U.S. Pat. No. 2,438,230, such approaches, while simple to implement, do not provide as great a freedom with respect to selectivity of colloids formed and their properties as those produced by the precipitation technique. U.S. Pat. No. 3,635,668 describes a process for the production of copper hydrate suitable for use as a fungicide. U.S. Pat. No. 3,082,103 demonstrates a universal milling technique by which finely divided oxides may be formed. It should also be noted that while most of the examples in the present invention are directed to formation of the colloidal solutions via precipitation techniques, the present invention is not limited to this approach. Specifically, catalytic colloidal composition may also be prepared by the dissolution and stabilization of properly prepared powders. Hence, the manner by which the chemical components are used in preparing said colloidal catalytic composition is a matter of convenience, e.g., shipping costs. The precipitation technique for producing the catalytic medium is believed however to possess certain advantages. Specifically, this technique is potentially capable of producing colloids of varied size, shape, and chemical make-up. This freedom is especially useful with respect to desired subsequent catalytic properties. Furthermore, such technique is also useful in the preparation of reduced metal or metal-alloys or compounds by adding a suitable precipitating agent (e.g., reducing agent), which can form the reduced metallic state or the alloys or the resulting compound(s) through its chemical interaction with the metal ion(s). Typical reducing agents are tannic acid, hydrazine, amineboranes, hypophosphites, borohydrides, sulfur types, etc. In the event that the colloids are prepared by a precipitation technique it may further be recommended that after preparation, centrifugation, washing and redispersion in pure water be undertaken thereby removing extraneous ionic species and insuring a medium with low ionic strength.

The stability of the above colloidal compositions may be enhanced by various techniques, e.g., dialysis, repetitive centrifugation and washings, as well as by the addition of various materials, referred to herein as stabilizers. The term "stabilizer" is used herein to generally describe chemicals believed to be adsorbed onto the colloids thereby altering the charge characteristics of said colloids and thus preventing their coagulation. Such stabilizers may be of organic or inorganic nature.

Stabilizers contemplated by the present invention include secondary colloids, polyalcohols, sugars, dispersants and surfactants, which while by themselves do not serve to catalyze the dielectric substrate in this process, they are believed to stabilize the active colloid by an encapsulation (or adsorption) mechanism. It is noted that for a specific composition more than one stabilizer may be present. Stabilizers may also be chemicals which take part within the colloidal double layer structure.

Typical secondary colloids are gum arabic, gelatin, agar agar, starch, albumin, hemoglobin, cellulose derivatives such as carboxymethyl cellulose and hydroxypropyl cellulose, N-alkylbeta-aminopropionic acid, carboxymethyl dextran, and the like. Typical sugars include mannitol, sorbitol, dulcitol maltose, and arbinose raffinose.

Surfactants may also be suitably employed as a stabilizer for the colloids. The surfactant, or surface active agent, as used herein generally refers to substances which are capable of lowering the surface tension of a liquid or the interfacial tension between two liquids. All such substances possess the common feature of a water-soluble (hydrophillic) group attached to an organic (hydrophobic) chain. Surfactants as used herein are also intended to encompass detergents, dispersants and emulsifying agents regardless of whether they are capable of lowering the interfacial surface tension. The surfactants used are not limited to the hydrocarbon type and they can be fluorocarbon or silicon bearing type.

It is also contemplated that a mixture of surfactants or surfactants with other stabilizers may be used. Care should be exercised (e.g., excess concentration) in the use of surfactants in the preparation of the present colloids, as would be noted by anyone skilled in the art.

The term "precipitation agent" as used herein is generally intended to encompass those chemical compounds which when contacted with metallic ions (with or without added energy) cause the onset (nucleation) of the secondary phase (insoluble phase). Typical materials may be reducing agents, hydroxides, sulphides and others. At times, depending on the chemical nature of the precipitation agents, codeposits within the resulting colloids are noted.

In general, the electroless coating process of the present invention comprises contacting (e.g., by immersion) the dielectric substrate, preferably previously etched with the colloid, i.e., the colloidal catalytic composition, washing the substrate and then contacting the colloid adsorbed substrate with a composition comprising an activating agent, (e.g., reducing agent) to form an activated state (e.g., reduced oxidation state) on the surface of the substrate, thus forming the catalytic nuclei active effective for the electroless build-up process upon subsequent immersion of the substrate in an appropriate electroless plating bath. Alternatively, the second step may be deleted.

Activation may also encompass a selective dissolution of the colloidal stabilizer(s) when present on the substrate.

For the sake of convenience, certain examples hereinafter will not refer to the intermediate rinsing step, but the need for such step should be recognized.

The following examples are illustrative of the present invention and are not to be taken in limitation thereof.

EXAMPLE 1

An ABS substrate was etched in a solution comprised of 400 g/l chromium oxide, 350 g/l concentrated sulfuric acid, and a flourocarbon surfactant for several minutes at a temperature of 70° C. Thereafter, the etched substrate was immersed in the colloidal dispersions for five minutes. Plating evaluation was carried out at room temperature using a typical commercial electroless copper bath. The colloidal compositions were as follows:

| | |
|---|---|
| $Cu(NO_3)_2$ | 0.1M |
| $Ni(NO_3)_2$ | 0.04M |
| $NaBH_4$ | 0.019M |
| NaOH | 0.19M |
| Orzan S | 12 g/l |
| Daxad 11 | 1.35 g/l |

Orzan S is predominantly sodium lignosulfate.
Daxad 11 is predominantly sodium salts of polymerized alkyl naphthalene sulfonic acids.

Test 1A: In this case the nickel and copper were admixed as above prior to the colloidal nucleation step.

Test 1B: Same as 1A, however, $NaBH_4$ and NaOH were reduced by 20% and nickel ions via the inorganic nickel compound were added post the copper colloid post nucleation to yield a 0.04 M concentration level. Induction times were found to be 20 sec and 10 sec for tests 1A and 1B, respectively. It is also noted that after the colloidal compositions, immersion into a 0.3 g/l dimethylamine borane solution at 49° C. for 3 minutes took place. Furthermore, in preparing the above colloids, nucleation, preferably above room temperature, took place. It is further noted that though the present colloids are derived using cupric ions, cuprous ions (Cu(I)) may be substituted and hence their incorporation falls within the spirit of this invention.

It is interesting to note that repeating the procedure of Example 1, however substituting cobalt, copper or iron for the nickel, did not reveal the unusual effect(s) encountered for nickel. It is further noted that though in this example certain specific nickel and copper salts were selected other salts or inorganic compounds of these metals may be substituted in a manner obvious to one skilled in the art. Further investigation of the unexpected results have demonstrated that the concentration of added nickel ions may be varied over a wide range while providing the noted improvement. In addition, examinations by electron microscopy using composition similar to 1A and 1B have shown marked differences, specifically the diffraction pattern (plates 7315 and 7317) for 1B showed a greater degree of amorphous nature in comparison to 1A. Also the transmission mode showed 1B to contain an extremely fine grained background.

While I do not wish to be bound by theory it would appear that the addition of nickel post the copper colloid nucleation is placed around the copper colloid and thereby the resulting adduct has a greater catalytic activity.

It should also be obvious that various approaches may be taken in the charging of such colloids, e.g., controlled addition of compound with specific anions such as hydroxyl ions and/or controlled addition of suitable surfactants and/or secondary colloids. In addition, the reference to catalytic metal in this invention is intended to encompass various colloidal end-products (e.g., metals, alloys, oxides, compounds, and mixtures thereof) bearing the catalytic metal(s) in any of several oxidation states which are non-noble. The catalytic composition may be the colloidal product as prepared or the colloidal product derived after further cleaning of the colloid has been made to remove extraneous (undesired) chemical species.

It will further be obvious to one skilled in the pertinent art that many modifications and variations may be made in the preceding description without departing from the spirit and scope of the present invention. For example, it will be apparent that mixtures of reducing agents may be used in a single solution or may be used in successive steps. Furthermore, it is within the scope of the present invention to delete the use of a separate reducing solution and directly immerse the substrate (contacted previously with the colloidal catalytic composition) in an electroless plating formulation containing one or more reducing agents.

It should also be recognized by those skilled in the art that, from the present teachings, multiple combinations of materials shown in separate examples are possible and such combinations fall within the spirit of the invention. It is understood that the term copper colloid encompasses colloids whose nucleus is of either elemental copper, compounds of copper or alloy of copper and mixtures thereof.

I claim:

1. A colloidal composition useful in the catalytic preparation of non-conductors prior to electroless plating comprising a copper colloid admixed with nickel ions and wherein said copper colloid is produced through the chemical interaction of copper ions with a reducing agent and further wherein the admixing of nickel ions takes place subsequent to the production of the copper colloid.

2. The colloidal composition according to claim 1 wherein said copper colloid is derived from a copper (II) compound.

3. The colloidal composition according to claim 1 wherein said copper colloid is derived from a copper (I) compound.

4. The colloidal composition according to claim 1 wherein said colloidal composition is derived from a dry powder.

5. The colloidal composition according to claim 1 wherein said reducing agent is an hydride.

6. The composition according to claim 1 wherein said non conductor is a printed circuit board.

7. The composition according to claim 1 wherein said colloidal composition further contains a colloidal stabilizer.

8. The composition according to claim 1 wherein said copper colloid is of copper metal.

* * * * *